United States Patent
Yamazaki et al.

[11] Patent Number: 5,648,000
[45] Date of Patent: Jul. 15, 1997

[54] PLASMA PROCESSING METHOD

[75] Inventors: Shunpei Yamazaki, Tokyo; Shigenori Hayashi, Kanagawa, both of Japan

[73] Assignee: Semiconductor Energy Laboratory Co., Ltd., Kanagawa-ken, Japan

[21] Appl. No.: 308,296

[22] Filed: Sep. 19, 1994

[30] Foreign Application Priority Data

Sep. 27, 1993 [JP] Japan .................. 5-264351

[51] Int. Cl.$^6$ .......................... H01L 21/3065
[52] U.S. Cl. .......... 216/67; 15/643.1; 15/646.1; 216/79
[58] Field of Search ............... 156/643.1, 646.1; 216/67, 79

[56] References Cited

U.S. PATENT DOCUMENTS

| | | | |
|---|---|---|---|
| 4,412,119 | 10/1983 | Komatsu et al. | 216/67 |
| 4,699,689 | 10/1987 | Bersin | 156/643.1 |
| 5,198,724 | 3/1993 | Koinuma et al. | 315/111.21 |
| 5,221,427 | 6/1993 | Koinuma et al. | 156/643.1 |
| 5,292,396 | 3/1994 | Takashima et al. | 216/67 |
| 5,304,407 | 4/1994 | Hayashi et al. | 427/569 |

*Primary Examiner*—T. Tung
*Attorney, Agent, or Firm*—Sixbey, Friedman, Leedom & Ferguson; Gerald J. Ferguson, Jr.; Bradley D. Blanche

[57] ABSTRACT

Ashing processing is performed using an atmosphere pressure discharge apparatus for stably producing discharge at an atmosphere pressure. Dielectric substance is arranged in a space between a pair of electrodes. A rare gas is flowed into the space. An electric field is generated in the space, thereby to produce plasma. A gas for providing oxygen to a rare gas is used as a reactive gas. The concentration of the reactive gas is 3% or less, in particular, 1% or less. Therefore, A resist film or the like formed on a substrate is removed (peeled).

16 Claims, 2 Drawing Sheets

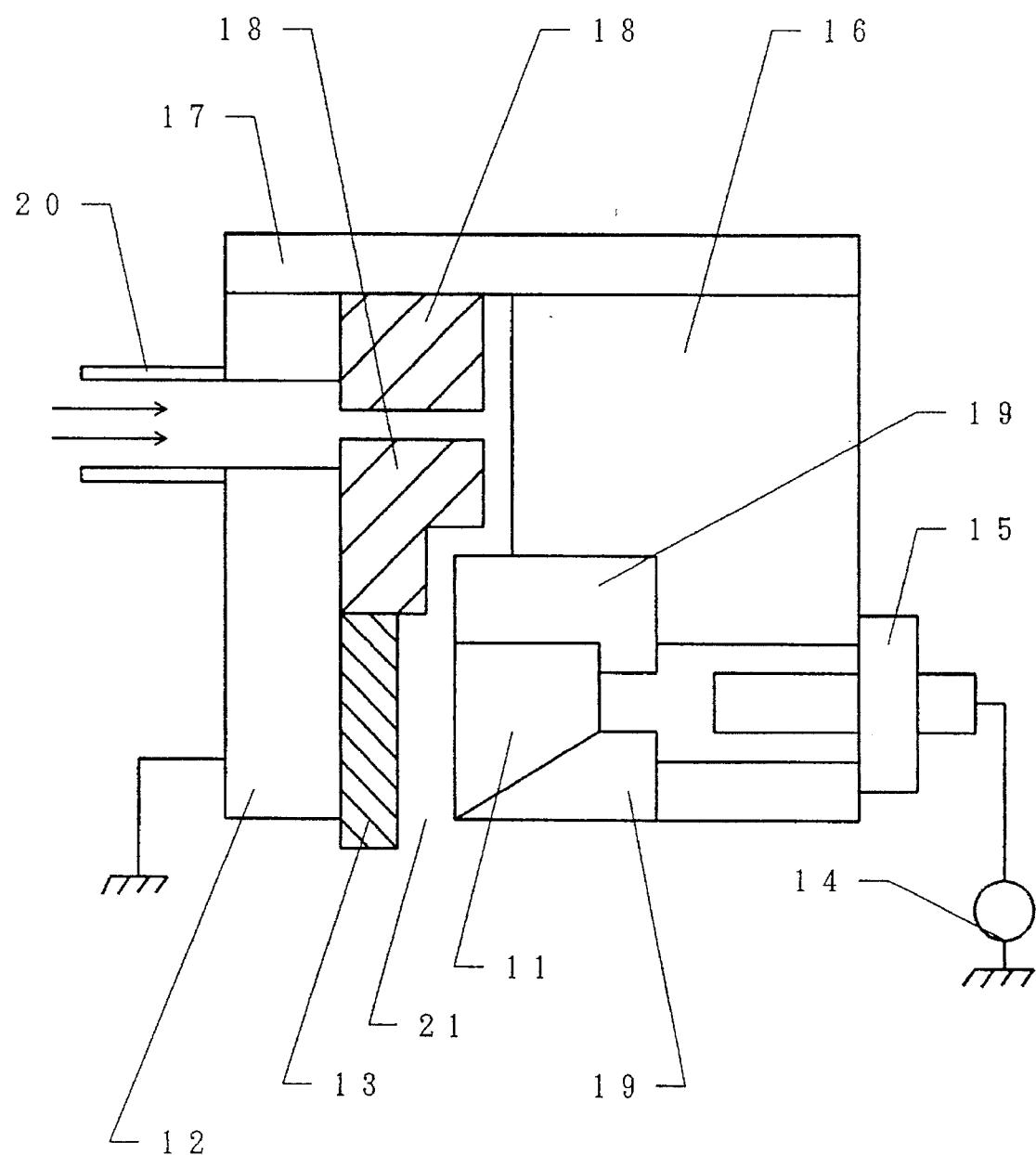
F I G. 1

PLASMA PROCESSING METHOD

BACKGROUND OF THE INVENTION

1. Field of the Invention

The present invention relates to a method and an apparatus for treating a substrate by stable discharge under an atmospheric pressure, in particular, an organic substance removing method and apparatus which are effective to removing (ashing) of organic substances and removing of remaining organic substances after washing a glass substrate in an LSI manufacturing process, an active matrix type LCD manufacturing process or the like.

2. Description of the Related Art

In a semiconductor manufacturing process such as a large scale integrated (LSI) manufacturing process and an active matrix type liquid crystal display (LCD) manufacturing process, a photoresist made of a photosensitive resin is used for mask formation. The photoresist is removed normally by ashing after completion of a desired process, because the resist is cured and carbonized and cannot be removed by a peeling solution. Ashing represents that active oxygen molecule, active ozone molecule, active oxygen atom or the like produced by discharge chemically acts on a resist film made of an organic substance, and the organic substance is removed. Ashing is a kind of combustion reaction.

To produce combustion reaction, it is necessary to produce radical (generic name of chemically active molecule, active atom or the like) which produces occurs oxidation reaction. Radical related to oxidation reaction includes oxygen atom/molecule classes such as oxygen molecule, excitation oxygen molecule, oxygen molecule ion, oxygen atom, oxygen atom ion, ozone molecule, excitation ozone molecule, ozone molecule ion or the like. The oxygen atom/molecule classes have energy levels of a ground state and various excitation states. Also, oxygen compound such as oxygen dinitride ($N_2O$), carbon monoxide, carbon dioxide has an energy level of a ground state or an excitation state.

Commonly, the higher a reactivity of radical is, the higher a reaction speed is, and the reactivity is high in order of oxygen molecule, ozone molecule and oxygen atom. Therefore, since a throughput gets high in an atmosphere including a number of oxygen atoms, it is advantageous to the ashing. On the other hand, when a number of radicals having high reactivity exist, a damage to a substrate gets larger. As a result, it is necessary to set a suitable process condition in accordance with a substrate to be treated.

Since combustion reaction is a reaction in a surface, the number of radicals and a reaction temperature are important factors in a reaction speed. Commonly, when the reaction temperature (substrate temperature) is high, the reaction speed gets high. Since a number of resists is made of a heat curable resin; when the substrate temperature is too high, a removing speed is reduced because the resist is cured. Therefore, ashing processing is performed commonly at about 200° C.

A method using discharge and a method using ultraviolet radiation are used to produce radical related to oxygen. The method using discharge includes a method for producing glow discharge plasma in a low pressure and a method using corona discharge in an atmospheric pressure.

The method for producing glow discharge plasma in a low pressure is commonly called low pressure glow discharge. In this method, a substrate to be treated is held into a reaction container capable of reducing a pressure. A pressure in the reaction container is controlled by a suitable reactive gas (oxygen, nitrogen oxide, carbon oxide or the like) at constant. Electromagnetic field is applied to the reactive gas by a pair of electrodes or inductive coupling type coils, thereby ionizing the reactive gas. A frequency of the electromagnetic field to be applied is a direct current (DC) to a microwave having about 2.45 GHz and is a wade range. Commonly, electromagnetic energy is applied by a pair of electrodes in a frequency of from the DC to an RF (radio frequency) having about several MHz and applied by the inductive coupling type coils in a frequency equal to and more than the RF. Since the microwave of about 2.45 GHz can be transmitted as a traveling wave in a quartz used as a wall material of a vacuum container, there is a case wherein energy is supplied as an electromagnetic wave without using electrodes in microwave plasma and ionization is generated. In this case, the electromagnetic wave is supplied as a traveling wave, a stationary wave, or a mixture of a traveling wave and a stationary wave. A reactive gas is exhausted from an exhaust apparatus connected to a reaction container and supplied from the reactive gas supply apparatus, simultaneously.

In the method using corona discharge in an atmospheric pressure, a perturbed (non-uniform) electric field is generated in the atmospheric pressure and ozone is mainly produced by corona discharge within the electric field. Since the perturbed electric field is used, this method is not suitable to a uniform processing in principle. A reason to produce ozone is as follows. Mean free pass in collision is short because of an atmospheric pressure. Also, oxygen atom ion or the like having large internal energy collides with neutron particle repeatedly and change with ozone molecule having a metastable state which life time is long.

In the method using ultraviolet radiation, ultraviolet rays are irradiated from a light source (commonly a low pressure mercury light) having wavelengths of no more than 200 nm and 200 to 300 nm to oxygen or dinitrogen monoxide, to produce ozone and excitation ozone. In principle, since ions are not produced by ultraviolet radiation, only ozones are produced. There is a case wherein two-photon absorption occurs in very low probability and ions are produced.

As described above, the method for producing radical related to oxygen includes two types roughly. One type is a method for mainly producing ozones, such as a corona discharge method and an ultraviolet radiation method. The other type is a method for producing various kind of radicals including oxygen atoms and ions, such as a low pressure glow discharge method. Though a damage to a substrate is small in the ozone producing method, a processing time is very short in the radical producing method. Therefore, the low pressure glow discharge method is commonly used as an ashing processing.

It is confirmed that the low pressure glow discharge method has desired processing capability. However, since a reaction space must maintain at a low pressure, various limitations, that is, increase of an apparatus cost by setting an exhaust apparatus for reducing a pressure, increase of a cost by using a reaction container having a sufficiently mechanical strength with respect to a low pressure state, complication of automatic mechanisms due to difficulty of transfer mechanisms under a high vacuum state, increase of an apparatus weight and an apparatus setting area by setting an exhaust apparatus and increase of a reaction container weight, reduction of throughout due to a vacuum exhaust time and a reaction container leak time and the like, are produced.

Since an ion action is utilized, a damage to a substrate cannot be neglected. This is a marked problem with high integration and high performance of a semiconductor. It is considered that a substrate damage by ions produces by formation of ion sheath within plasma. The ion sheath produces in a case wherein an electron temperature and an ion temperature in plasma do not agree with each other and it is in thermally unbalance state. It has been known that an electron temperature in a common low pressure glow discharge is several eV (several ten thousand degree) and an ion temperature is several ten meV (several hundred degree). Commonly, the lower a pressure is, the higher the electron temperature is. In ECR (electron cyclotron resonance) discharge at a low pressure, the electron temperature may be ten and several eV. Therefore, it is considered that a substrate damage by ions increases in accordance with decrease of the pressure. Experimentally, the lower the pressure is, the larger the substrate damage is.

When substrate treatment is performed at a low pressure, the above problem produces. On the other hand, a method for treating a substrate by producing ozones at an atmospheric pressure provides advantages, such as simplifying an apparatus, low apparatus cost, and providing a damage free substrate as well as other similar advantages. However, since substrate treatment time is long, practical use is, limited partically. Therefore, it is desired to obtain an ashing apparatus which has not an exhaust apparatus, an apparatus cost is low and a substrate damage is small.

SUMMARY OF THE INVENTION

To solve the above problems, stable discharge is performed by the inventors at an atmosphere pressure and applied to an ashing processing. There are U.S. Pat. (Nos. 5,304,407, 5,198,724, 5,221,427) related to discharge at an atmosphere pressure. Also, there are various methods for producing stable discharge at an atmosphere pressure. For example, there is a method for producing thermal plasma by arc discharge or the like. This method is mainly used in melt processing for a metal or the like by the existence of cathode bright point which is a condition for arc discharge (melting of electrode materials) and negative resistance of plasma (possibility of thermorunaway and necessity of stablilizer). However, it is not suitable to operate the process at a relatively low temperature (400° C. or less). Further, there is corona discharge such as surface creeping discharge. This method is a technique used to produce mainly ozones. Since a discharge state changes by an electrode shape, it is not suitable to large area processing. On the other hand, since plasma having high density can be produced stably by discharge at an atmosphere pressure by the inventors, it is suitable to plasma processing such as surface processing.

In the above discharge method by the inventors, a pair of electrodes having a concentric cylindrical shape or a parallel plate shape is placed and a dielectric substance is arranged on one side or both sides of opposite surfaces of the electrodes. A shape of an electrode surface is not necessary to limit a comb shape or a needle shape. A rare gas (He, Ne, Ar, Xe, Kr) is flowed in a space between dielectric substances or a space between dielectric substance/electrodes at a laminar flow state and ionized by an electric field generated by applying an AC voltage to the electrodes. For application to plasma processing, line plasma produced by parallel plate electrodes is superior to beam plasma produced by concentric cylindrical electrodes.

Line plasma produced by the parallel plate electrodes will be described below using FIG. 1.

A dielectric substance 13 is placed between a voltage supply electrode 11 and an opposite electrode 12 combined with frames. The electrodes 11 and 12 are held by a front frame 16, an upper cover 17, an insulating structure member 18 and an insulating electrode hold member 19. A voltage is applied from a power supply 14 to the voltage supply electrode 11 through a power supply terminal 15. A rare gas is supplied from a gas introducing tube 20 through a flow volume control system (not shown) and flows into an external area through a plasma producing region (space) 21.

A material of the electrode 11 is a conductor. It is desirable to use a material which does not react to a reactive gas when etching, ashing, deposition or the like is performed by adding a reactive gas to a rare gas. When halogen gas is added to a rare gas, it is desirable to use a chemically stable material such as gold, silver, platinum, stainless steel without an etchable material such as tungsten.

It is not necessary to provide an uneven shape such as a comb or a needle on a surface of the electrode 11. Therefore, the electrode 11 has a flat surface. Since the flat surface forms a gas flow close to an ideal laminar flow, plasma can be produced uniformly. It is desirable to obtain sufficiently flat surface in comparison with a size of the electrode. For example, a five point average roughing (Ra) is about 10 µm.

The dielectric substance 13 is provided to prevent generation of arcing, it is preferred that a dielectric substance has high dielectric constant. Because the higher a dielectric constant is, the lower a frequency of discharge is. Though a thin dielectric substance prefers as the dielectric substance 13, dielectric breakdown occurs easily as a thickness become thin. Also, it is necessary to use the dielectric substance 13 which does not include a pinhole as a sintering substance because dielectric breakdown occurs in a pinhole portion. As a material for the dielectric substance 13, a material having a dielectric constant (relative dielectric constant is 9) equal to and larger than a dielectric constant of alumina, for example, alumina, zirconia, PZT (lead zirconate titanic acid), YSZ, ($Y_2O_3$ stabilized $ZnO_2$) or STO ($SrTiO_3$), is used. Though quartz has a low relative dielectric constant, when a frequency of an applying voltage is equal to and larger than RF frequency such as 13.56 MHz, quartz can be used. It is preferred that a thickness of the dielectric substance 13 is 50 µm to 5 mm, experimently. When the thickness is lower than 50 µm, dielectric breakdown occurs. On the other hand, when the thickness is larger than 5 mm, it is difficult to produce discharge.

It is possible to utilize about 50 Hz (commercial frequency) to 2.45 GHz (microwave frequency) as a frequency of a voltage applied to the electrode 11. The higher the frequency is, the easier discharge produces. However, cost of the power supply 14 increases. It is desired that an applying power is 5 $W/cm^2$ to 5000 $W/cm^2$ in a power density standardized using an electrode area. Though the applying power is a large value in comparison with low pressure glow discharge, since an atmosphere has an atmosphere pressure, the above value is desirable as an electric field strength consumed for respective gas particles. A lower limit value of the above power density corresponds to a lower limit value of a voltage necessary to maintain discharge, and an upper limit value of the above power density represents limitation of dielectric breakdown generated by heating in plasma. Therefore, the upper limit value can be further increased by cooling an apparatus or the like.

Various processes can be performed by adding a reactive gas to a rare gas. It is desirable to supply a reactive gas through a flow volume control system. A reactive gas can be supplied by mixing it into a rare gas from the gas introducing tube 20. Also, it is possible to supply a reactive gas near a substrate to be treated through a nozzle (not shown) after a rare gas is passed through the plasma producing region 21.

When the reactive gas into which the rare gas is mixed is supplied, a time period which the reactive gas stays in a plasma producing region (space) is important for substrate treatment capacity from experiments of the inventors. That is, the substrate treatment capacity changes greatly in accordance with relation between a length of a gas flow direction in the plasma producing region and a gas flow volume. When a gas staying time in the plasma producing region is short (when a gas flow volume is large or when a length of a gas flow direction is short), a reactive gas passes through the plasma producing region before it is excited sufficiently. On the other hand, when a gas staying time in the plasma producing region is long (when a gas flow volume is small or when a length of a gas flow direction is long), the excited reactive gases collide frequently. Therefore, it is considered that reactivity is lost by association of active radicals. In ashing, a suitable gas staying time is 10 µs to 100 ms. A length of a gas flow direction in a plasma producing region can be represented approximately by a length of the power supply electrode.

In ashing, oxygen can be used as a reactive gas. As shown in FIG. 2, ashing speed decreases in accordance with increase of oxygen concentration. Since ashing is performed in a case wherein oxygen concentration is 0%, it is represented that a suitable value of oxygen concentration is 0 to 0.25%. This suggests the following. That is, since oxygen electrifies negatively, when oxygens exist excessively, electrons in plasma are trapped by oxygens and therefore plasma density reduces (quench effect). This is a characteristic of atmosphere pressure discharge. In practice, it is preferred that oxygen concentration is 3% or less, in particular, 1% or less. This is realized in relation between a gas flow direction in a plasma producing region and a gas flow volume within the gas staying time.

An effective discharge length in the apparatus can be increased by mechanical processing precision which an uniformity of an electrode interval is obtained. The higher a processing precision is, the longer the effective discharge length is. However, in a current processing precision (about 100 µm), the effective discharge length is about 1 m. An upper limit value of the electrode interval is determined whether or not discharge producing start voltage can be applied. A lower limit value is determined so as not to largely increase a gas flow rate, and a suitable lower limit value is 50 µm to 5 mm.

BRIEF DESCRIPTION OF THE DRAWINGS

FIG. 1 shows a cross section of discharge apparatus for performing ashing processing according to an embodiment of the present invention.

DETAILED DESCRIPTION OF THE PREFERRED EMBODIMENT

Figure 2:
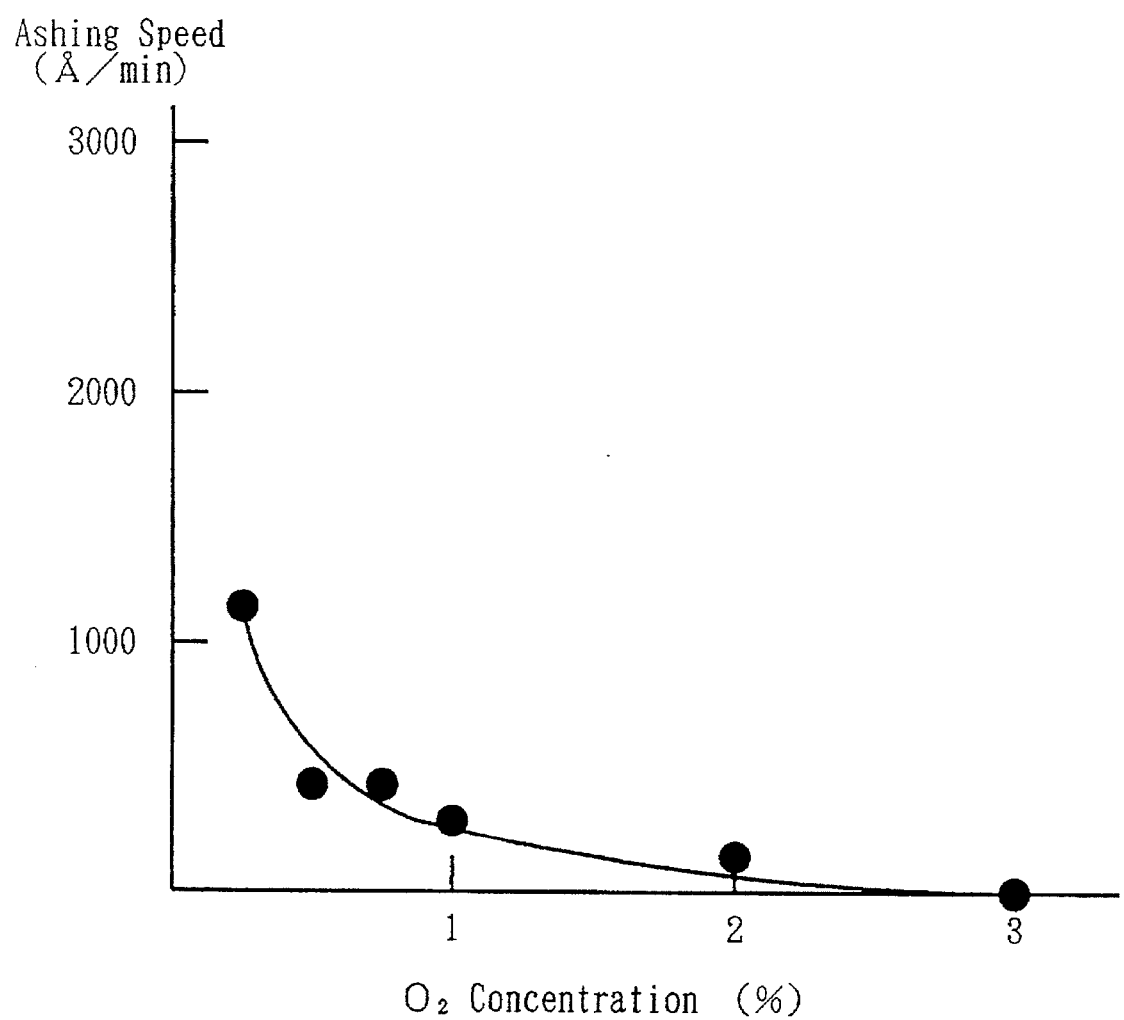
FIG. 2 shows a graph representing a relation between an ashing speed and oxygen concentration.

In the embodiment, a reactive gas is oxygen and a rare gas is argon, and line plasma producing apparatus is used.
[Preparation of Substrate]

A glass substrate having 100 mm square used in production process of a thin film transistor (TFT) for a liquid crystal display (LCD) is used. In the embodiment, ashing capacity for resist peeling preformed after ion doping for channel forming is examined. A resist is a positive type resist (a product of Tokyo Oka Co. Ltd., OFPR-800) having coefficient of viscosity of 30 cps.

After spin coating, prebaking is performed at 80° C. for 20 minutes. Exposure by ultraviolet rays (2 mW) having a center wavelength of 365 nm is performed for 20 seconds using a mask, development is performed for 1 minute using a developer NMD3 (a product of Tokyo Oka Co. Ltd.). Postbaking is performed at 130° C. for 30 minutes after washing. A thickness of a resist film after postbaking is 2 µm. Then, boron of $1 \times 10^{19}$ atoms/cm$^3$ is ion-implanted (ion-doped). Since the resist film is heated by ion-implantation, it cannot be almost peeled by a peeling solution stripper 10 (a product of Tokyo Oka Co. Ltd.).
[Ashing Processing]

Ashing processing for a resist film formed on a substrate is performed using the above apparatus. Discharge conditions are as follows.

Electrode material: Stainless steel (SUS416)
Effective discharge length: 150 mm
Electrode/dielectric substance interval: 0.5 mm
Electrode length: 20 mm
Dielectric substance length: 100 µm
Dielectric substance material: Zirconia
Argon flow volume: 9 SLM
Gas staying time: 10 ms
Applying electric field frequency: 13.56 MHz
Applying power: 3 kW (100 W/cm2)
Reactive gas: oxygen
Oxygen flow volume: 9 sccm
Reactive gas mixing method: rare gas (argon) mixing method Plasma is produced under the above discharge condition. It is confirmed that a resist film is removed (peeled) from a substrate at 1.5 mm during about 2 minutes and 15 seconds by ashing processing. This corresponds to about 6700 Å/minute of an ashing rate and is superior to an ashing rate in a low pressure (1000 Å/minute). A distance between an opening of the discharge apparatus and an electrode surface is 2 mm.

In the embodiment, only ashing processing along a line can be performed. However, two dimensional ashing processing can be preformed by: setting a plurality of lines; scanning the lines in a direction vertical to a line direction; placing a substrate on a transfer mechanisms; and passing through under at least one of fixed discharge apparatuses.

TFT formed in the embodiment has necessary characteristics, and a result that TFT is damaged by a substrate treatment is not obtained.

As described above, an ashing speed increases and a substrate does not damage by ashing processing for a substrate treatment according the present invention. Therefore, a semiconductor device having high reliability can be manufactured. Also, since a discharge apparatus of the embodiment has not a vacuum exhaust apparatus, a discharge apparatus has a simple structure and an apparatus cost can be reduced.

What is claimed is:

1. A plasma processing method at an atmosphere pressure comprising the steps of:

placing a dielectric substance in a space between a pair of electrodes, wherein the dielectric substance is in contact with one of the electrodes;

supplying a rare gas to the space;

applying power to the electrodes, to produce plasma of the rare gas; and supplying a reactive gas of oxygen or an oxygen compound to a substrate having an organic substance through the plasma, to remove the organic substance from the substrate, wherein a concentration of the reactive gas is 3% or less.

2. The method of claim 1 wherein the concentration of the reactive gas is 1% or less.

3. The method of claim 1 wherein the concentration of the reactive gas is 0.25% or less.

4. The method of claim 1 wherein the reactive gas includes one of dinitrogen monoxide, carbon monoxide and carbon dioxide.

5. A plasma processing method at an atmosphere pressure comprising the steps of:

placing a dielectric substance in a space between a pair of electrodes;

supplying a rare gas to the space;

generating a electric field in the space by supplying power to the electrodes, to produce plasma by the rare gas; and supplying a reactive gas of oxygen or an oxygen compound to a substrate through the plasma, wherein a concentration of the reactive gas is 3% or less.

6. The method of claim 5 wherein the concentration of the reactive gas is 1% or less.

7. The method of claim 5 wherein the concentration of the reactive gas is 0.25% or less.

8. The method of claim 5 wherein the electrodes comprise parallel plate electrodes.

9. The method of claim 5 wherein the dielectric substance has a relative dielectric constant of 9 or more.

10. The method of claim 5 wherein the reactive gas includes one of dinitrogen monoxide, carbon monoxide and carbon dioxide.

11. A plasma processing method comprising the steps of:

placing a dielectric substance in a space between a pair of electrodes, wherein the dielectric substance is in contact with one of electrodes;

introducing a gas mixture including a reactive gas of oxygen or an oxygen compound and a rare gas into said space;

applying a voltage between the electrodes to produce a plasma of said gas mixture and treating a surface of an object with said plasma to remove an organic substance thereon, wherein a concentration of the reactive gas is 3% or less.

12. The method of claim 1 wherein the concentration of the reactive gas is 1% less.

13. The method of claim 11 wherein the concentration of the reactive gas is 0.25% or less.

14. The method of claim 11 wherein the electrodes comprise parallel plate electrodes.

15. The method of claim 11 wherein the dielectric substance has a relative dielectric constant of 9 or more.

16. The method of claim 11 wherein the reactive gas includes one of dinitrogen monoxide, carbon monoxide and carbon dioxide.

* * * * *